United States Patent [19]

Powell

[11] Patent Number: 5,034,699
[45] Date of Patent: Jul. 23, 1991

[54] TRIMMING OF OPERATIONAL AMPLIFIER GAIN

[75] Inventor: Jeffrey L. Powell, Portland, Oreg.
[73] Assignee: Tektronix, Inc., Beaverton, Oreg.
[21] Appl. No.: 612,377
[22] Filed: Nov. 14, 1990
[51] Int. Cl.⁵ .............................................. H03G 3/00
[52] U.S. Cl. ...................................... 330/86; 330/282
[58] Field of Search ................... 330/86, 110, 112, 282

[56] References Cited

U.S. PATENT DOCUMENTS 4,918,397  4/1990  Kidger .................................. 330/86

Primary Examiner—James B. Mullins
Attorney, Agent, or Firm—Francis I. Gray

[57] ABSTRACT

A method of adjusting the gain of an operational amplifier using a digital-to-analog converter (DAC) based upon R-2R resistive ladder technology inserts the DAC between the output of the operational amplifier and the non-inverting input to form a positive feedback loop. Variations of a digital control code applied to the DAC to control the gain are not affected by corresponding variations in the output resistance of the DAC so that undesirable changes in the magnitude of output noise, drift, bandwidth and offset voltage are minimized.

2 Claims, 1 Drawing Sheet

TRIMMING OF OPERATIONAL AMPLIFIER GAIN

BACKGROUND OF THE INVENTION

The present invention relates to operational amplifiers, and more particularly to an improved method of adjusting operational amplifier gain to reduce undesirable changes in bandwidth, output offset voltage and output noise due to gain change.

Gain adjustment of an operational amplifier can be accomplished by connecting a R-2R resistive ladder digital-to-analog converter, i.e., multiplying DAC, as an adjustable feedback element. When placed in the feedback loop the multiplying DAC permits adjustment of the feedback current, and therefor gain, for the operational amplifier. Conventionally the multiplying DAC is placed in the negative feedback loop.

Operational amplifier input offset voltages, offset voltage drift and noise are amplified by an amount determined by the closed loop gain. Bandwidth also is a function of closed loop gain. The non-inverting gain, i.e., noise gain, is calculated as $$Gn = (Rin + Rfb)/Rin.$$

When connected as a variable feedback element the multiplying DAC output is connected to the amplifier inverting input. In this configuration the DAC output resistance Rout parallels Rin, increasing the noise gain Gn. The gain due to undesirable input error voltages and noise is now $$Gn = ((Rin//Rout) + Rfb)/(Rin//Rout).$$

DAC output resistance Rout is not constant, but varies as a function of digital control code. The magnitude of Rout variation may range from 0.75 times the DAC characteristic resistance Rdac to near infinity. Wide variations in Rout thus result in wide variations in noise gain Gn. For example, if Rin=Rfb=1 Mohm and Rdac=10 kohm, then Gn varies between 2 and 135.5. For every millivolt of input noise, input offset voltage or input offset voltage drift the output magnitude ranges between 2 mV and 135.5 mV. Additionally because the product of gain times bandwidth is constant, the variations in Gn cause corresponding changes in bandwidth.

What is desired is a method of adjusting operational amplifier gain to reduce undesirable changes in bandwidth, output offset voltage and output noise due to gain change resulting from changes in a digital control code input to a DAC used to adjust the gain of the operational amplifier.

SUMMARY OF THE INVENTION

Accordingly the present invention provides a method of trimming operational amplifier gain using a digital-to-analog (DAC) based upon R-2R resistive ladder technology that reduces undesirable changes in the magnitude of output noise, drift and offset voltage resulting from changes in a digital control code input to the DAC. The DAC is coupled to form a positive feedback loop for the operational amplifier, with the input of the DAC being coupled to the output of the amplifier and the output of the DAC being coupled to the non-inverting input of the amplifier. As a result of this configuration the DAC output resistance, which varies over the range of digital control code changes, has no effect upon the "noise gain" of the operational amplifier.

The objects, advantages and other novel features of the present invention are apparent from the following detailed description when read in conjunction with the appended claims and attached drawing.

DESCRIPTION OF THE PREFERRED EMBODIMENT

Figure 1:
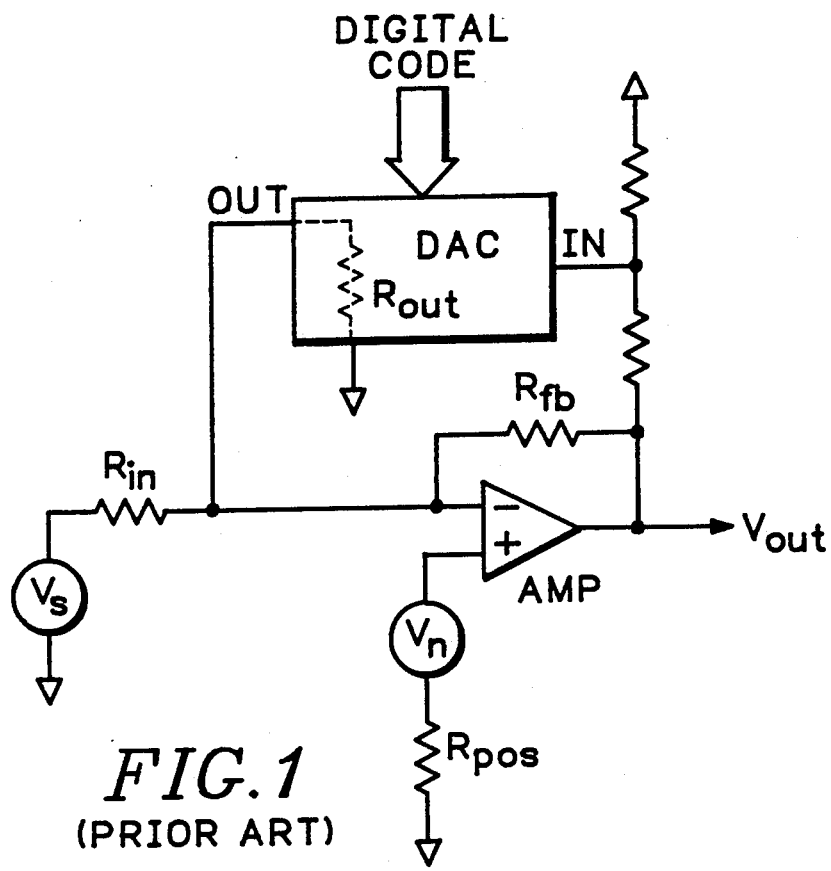
FIG. 1 is a schematic view of a prior art operational amplifier with a DAC used for trimming gain.
Figure 2:
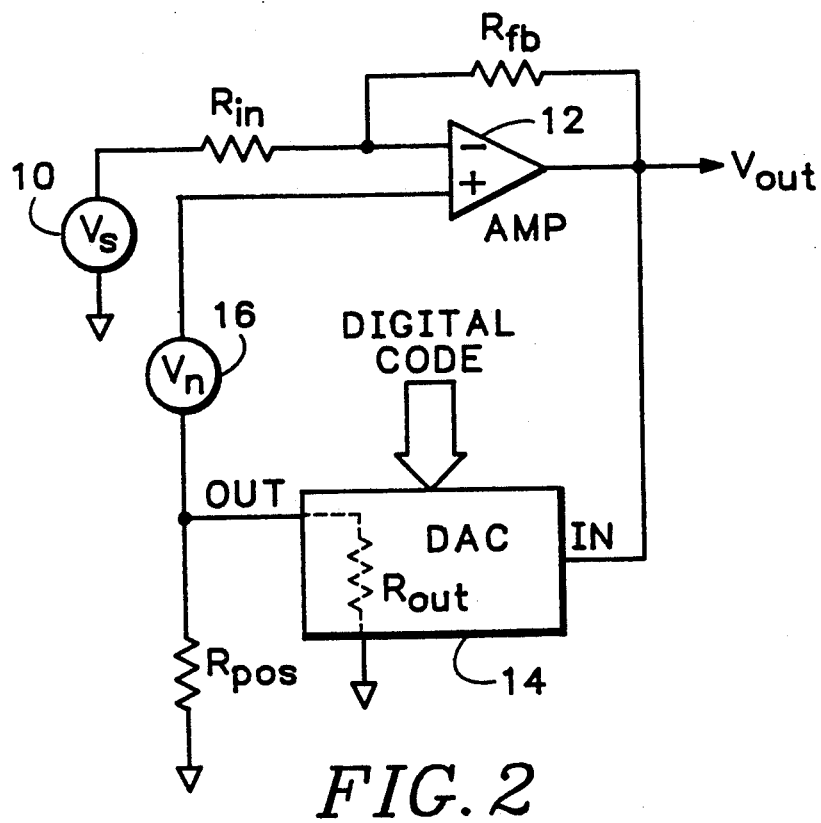
FIG. 2 is a schematic view of an operational amplifier with a DAC used for trimming gain according to the present invention.

Referring now to FIG. 2 an input signal source 10 provides a desired signal Vs to the inverting input of an operational amplifier 12 via an input resistor Rin. A feedback resistor Rfb is coupled between the output and the inverting input of the operational amplifier 12 to form a negative feedback loop. The non-inverting input of the operational amplifier 12 is coupled to a reference potential via a resistor Rpos. A digital-to-analog converter (DAC) 14, based upon R-2R resistive ladder technology, has its input coupled to the output of the operational amplifier 12 and its output coupled to the non-inverting input of the amplifier to form a positive feedback loop. Noise Vn in the operational amplifier 12 may be considered to be a noise signal source 16 coupled to the non-inverting input.

Because "noise gain" is not a function of Rpos, changes in the DAC resistance Rout have no effect. The "noise gain" is (Rin+Rfb)/Rin. For example with Rin=Rfb=1 Mohm and Rout=10 kohm, the "noise gain" is 2 regardless of the digital control code input to the DAC 14. Additionally since the "noise gain" remains constant, the bandwidth remains constant and the frequency response is not a function of the DAC resistance Rout. In many cases Rin and Rfb may be large so that DAC leakage currents flowing in these large resistors produce undesirable output voltages. However with the DAC 14 in the positive feedback loop, Rpos is usually much smaller than Rin and Rfb and the effect of DAC leakage current is much reduced.

Thus the present invention provides an improved method of trimming operational amplifier gain using a digital-to-analog converter by placing the DAC in the positive feedback loop to reduce undesirable changes in the magnitude of output noise, drift and offset voltage resulting from variations in the output resistance of the DAC in response to variations in a digital control code signal applied to the DAC to control the gain.

What is claimed is:

1. An improved operational amplifier of the type having an inverting input, a non-inverting input and an output with an input resistor coupled to the inverting input to couple an input signal to the operational amplifier, with a bias resistor coupled between the non-inverting input and a reference potential, and with a feedback resistor coupled between the output and the inverting input to form a negative feedback loop, the improvement comprising a digital-to-analog converter based upon R-2R resistive ladder technology having an input coupled to the output of the operational amplifier and having an output coupled to the non-inverting input of the operational amplifier, the digital-to-analog converter receiving a digital control code to vary the gain of the operational amplifier.

2. A method of trimming the gain of an operational amplifier having an output terminal, an inverting input terminal and a non-inverting input terminal comprising the steps of:

inserting a digital-to-analog converter between the output terminal and the non-inverting input terminal to form a positive feedback loop; and applying a digital control code to the digital-to-analog converter to control the gain of the operational amplifier.

* * * * *